United States Patent [19]

Cutchaw

[11] Patent Number: 4,612,978
[45] Date of Patent: * Sep. 23, 1986

[54] APPARATUS FOR COOLING HIGH-DENSITY INTEGRATED CIRCUIT PACKAGES

[76] Inventor: John M. Cutchaw, 7333 E. Virginia Ave., Scottsdale, Ariz. 85257

[*] Notice: The portion of the term of this patent subsequent to Jul. 23, 2002 has been disclaimed.

[21] Appl. No.: 721,074

[22] Filed: Apr. 8, 1985

Related U.S. Application Data

[63] Continuation-in-part of Ser. No. 513,618, Jul. 14, 1983, Pat. No. 4,531,146.

[51] Int. Cl.⁴ ............................................. H01L 23/46
[52] U.S. Cl. ............................. 165/104.33; 62/259.1; 165/46; 357/82; 361/385
[58] Field of Search ................. 165/104.33, DIG. 8, 165/DIG. 10, DIG. 5, 185, 80 C, 46; 357/82; 361/385; 62/259.1

[56] References Cited

U.S. PATENT DOCUMENTS

| | | | |
|---|---|---|---|
| 3,274,429 | 9/1966 | Swiadek | 165/DIG. 8 |
| 3,732,919 | 5/1973 | Wilson | 165/DIG. 8 |
| 3,995,181 | 11/1976 | Suit | 165/104.33 |
| 4,109,707 | 8/1978 | Wilson et al. | 357/82 |
| 4,155,402 | 5/1979 | Just | 165/104.33 |
| 4,263,965 | 4/1981 | Mansuria et al. | 165/80 C |
| 4,531,146 | 7/1985 | Cutchaw | 357/81 |

OTHER PUBLICATIONS

McGregor, J. E., *Component Support and Cooling*, IBM Technical Disclosure, vol. 2, No. 5, 2/1960.

*Primary Examiner*—Albert W. Davis, Jr.
*Attorney, Agent, or Firm*—Herbert E. Haynes, Jr.

[57] ABSTRACT

An apparatus for cooling a high-density integrated circuit package includes a base in which the circuit package is mounted and a heat exchanger which mounts on the base to enclose the circuit package and carry away the operational heat thereof by means of a coolant which is passed through the heat exchanger. The heat exchanger includes a housing having a coolant chamber with an especially configured thermally conductive wall for engaging the integrated circuit package. The coolant chamber is filled with a plurality of thermally conductive spheroids which are biased into thermally conductive contact with each other and with the special wall to maximize the heat exchange surface in the coolant chamber. The apparatus is preferably employed in combination with a refrigeration system wherein the coolant chamber is the evaporation element of the system for maximum cooling of the integrated circuit package.

28 Claims, 7 Drawing Figures

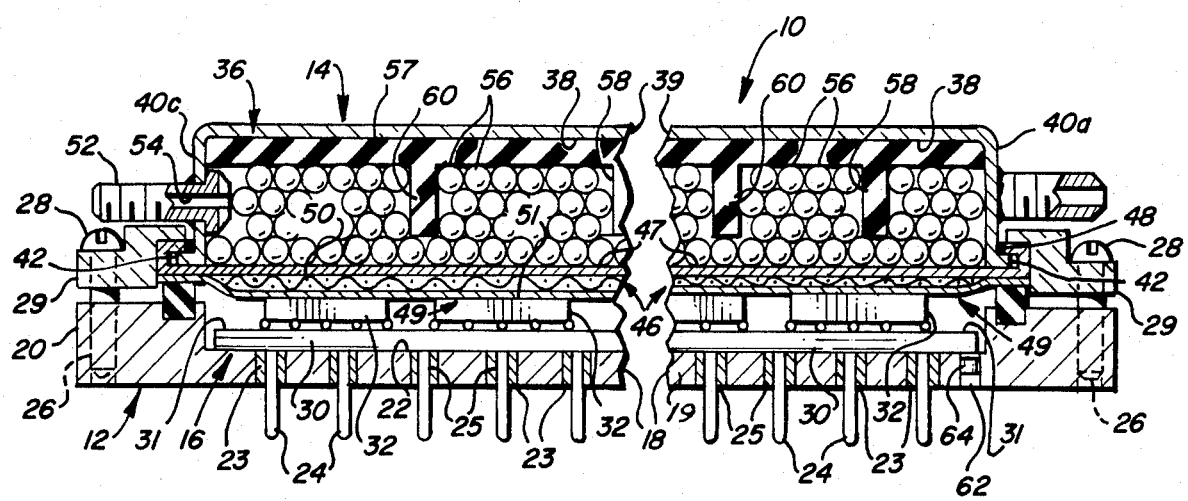
FIG-4
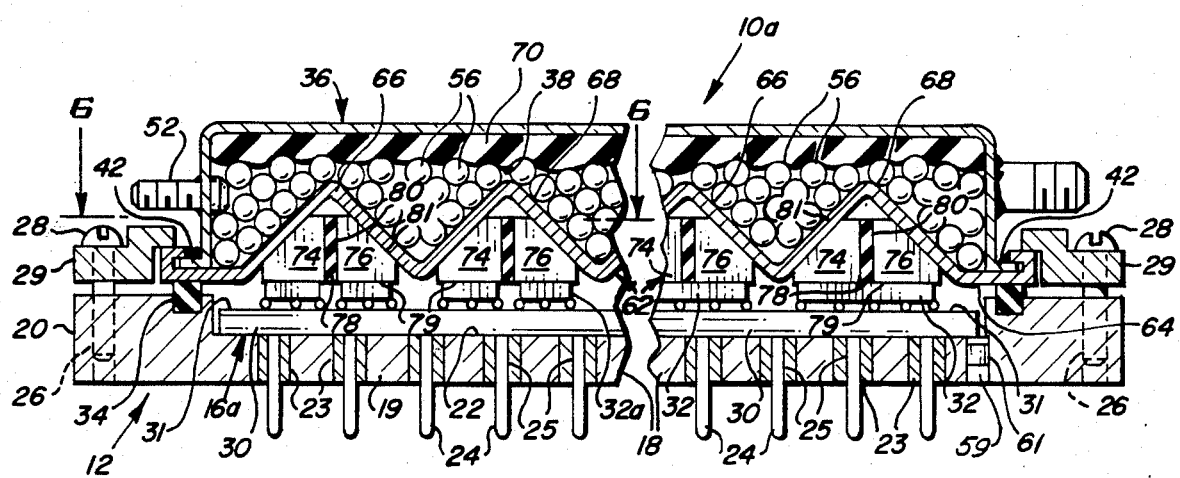
FIG-5
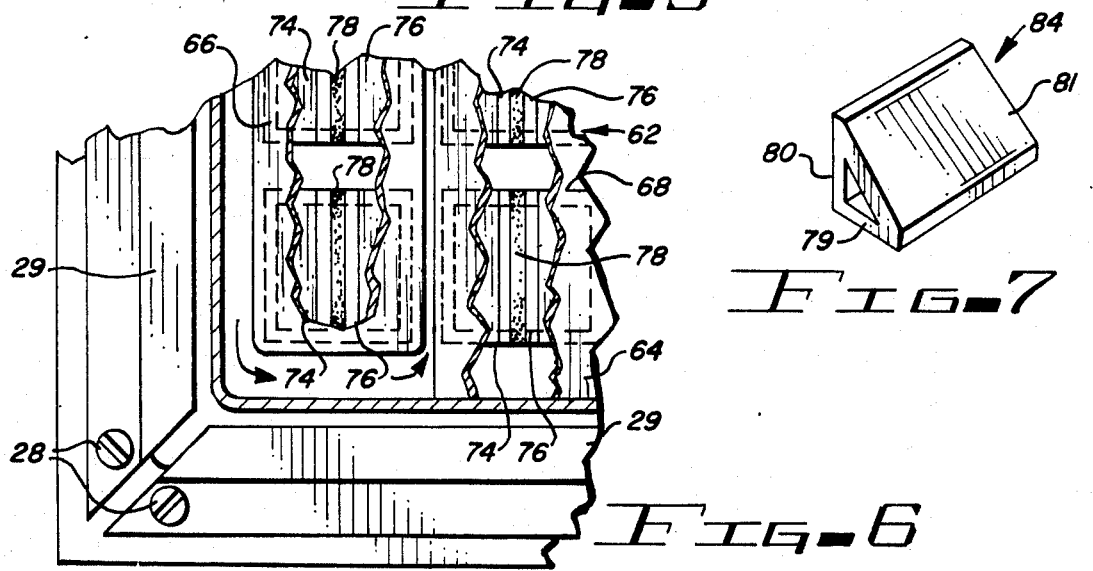
FIG-6
FIG-7

APPARATUS FOR COOLING HIGH-DENSITY INTEGRATED CIRCUIT PACKAGES

CROSS REFERENCE TO RELATED APPLICATION

This application is a continuation-in-part of my co-pending U.S. patent application Ser. No. 513,618, filed July 14, 1983, for APPARATUS FOR COOLING HIGH-DENSITY INTEGRATED CIRCUIT PACKAGES which issued as U.S. Pat. No. 4,531,146 on July 23, 1985.

BACKGROUND OF THE INVENTION

1. Field of the Inventions

This invention relates to cooling mechanisms and more particularly to an apparatus for cooling high-density integrated circuit packages.

2. Description of the Prior Art

In the electronics industry in general, and the computer arts in particular, one design objective for some time now has been aimed at increasing operational speeds and decreasing unit sizes. One of the major factors which contributed significantly to this objective is, of course, the integrated circuit chip, or dice as it is sometimes referred to in the industry. Initially, a single dice was mounted in a suitable package, such as a dua-lin-line package, and such packages are in common use. However, the trend today is for mounting a plurality of dice in a single package to increase operating speeds by reducing the distances that signals must travel, and also reduce spaces occupied by the individual dice packaging technique.

Significant gains were made when plural dice were mounted on a two-sided substrate and encapsulated in what is known as a JEDEC package. In those packages, electrical connections between the plural dice are made within the encapsulating package, and electrical contacts are provided about the package periphery for connection with with other components of the overall system. The limiting factor of these JEDEC packaging arrangements is the space available on the opposite sides of the substrate for connecting the dice together.

Another relatively recent development in this field is the use of a multi-layer substrate which significantly increases the space available for internal connections. In particular, one package developed by IBM Corporation has successfully mounted 133 dice on a multi-layer ceramic substrate having 33 layers. This package is 90 mm square and has an array of 361 pins depending from the bottom surface of the multi-layer substrate. The pins are soldered into a circuit board which electrically connects the individual pins to the proper components of the overall system.

While this relatively new dice packaging has achieved the desired increased operating speeds, and reduced the overall size, the ultra-high packaging density has created problems relating to heat dissipation. Cooling by radiation into the atmosphere is completely out of the questions, and the use of blowers for moving relatively high velocities of air across the packages is inadequate, and liquid cooling systems are being used.

Many of the earlier developed liquid cooling systems, some were developed for use with the JEDEC packages, are inadequate for use with the newly developed multi-layer packaging technology due to insufficient heat transfer between the plural dice and the liquid coolant, and their inability to carry away a sufficient amount of heat generated by the large number of dice.

The cooling system developed by IBM Corporation for use with the hereinbefore described multi-layer packages, includes intricate metal castings, one of which contains the package in a helium filled environment which is provided with 133 bores, each containing a spring-loaded piston. Each of these pistons is in contact with a different one of the dice to carry heat away from the dice through the piston, spring, and metal of the casting. Another metal casting is carried atop the piston casting to provide a chilled coolant chamber, which absorbs heat from the lower casting. This cooling apparatus is an exceptionally complex and costly mechanism, occupies a considerable amount of space, and its thermal transfer efficiency is questionable due to the plural heat conductors and interfacing gaps which are encountered by heat migrating from the dice through the pistons, through the springs, through the metal top wall of the lower casting, through the metal lower wall of the top casting and ultimately to the circulating coolant.

Another prior art structure which is disclosed in my U.S. Pat. No. 4,381,032, includes a base in which the high-density circuit package is nestingly mounted. A heat exchanger is mounted on the base so as to sealingly enclose the circuit package. The heat exchanger includes a rigid housing having a downwardly opening coolant chamber which is enclosed by a thin wall metallic diaphragm that rests in thermally conductive contiguous contact with each of the dice of the integrated circuit package. A liquid coolant is circulatingly moved through the coolant chamber which biases the diaphragm into conductive contact with the dice in addition to its carrying away the heat generated by operation of the integrated circuit package. To insure a more positive contact between the diaphragm and the dice, additional biasing forces are applied to the diaphragm by elastomeric elements, or spring-loaded pistons, provided in the cooling chamber, and these elastomeric elements, or spring-loaded pistons, apply their biasing force to localized areas of the diaphragm with those areas being those which are in contact with the dice of the circuit package. Although this prior art structure is quite efficient, its ability to carry away the operational heat of the operating integrated circuit package is limited by the heat transfer capabilities of the thin-wall diaphragm and the ability of the circulating coolant to absorb the heat transferred thereto by the diaphragm.

Therefore, a need exists for a new and improved apparatus for cooling high-density integrated circuit packages which overcomes some of the problems and shortcomings of the prior art.

SUMMARY OF THE INVENTION

In accordance with the present invention, a new and improved apparatus for cooling high-density integrated circuit packages is disclosed as including a base means for nestingly containing the high-density integrated circuit package which is sealingly enclosed therein by an especially configured heat exchanger, which is demountably carried on the base means. The improved apparatus is ideally suited for use in combination with a refrigeration system.

The heat exchanger includes a rigid metallic housing having a downwardly opening coolant chamber formed therein, which is sized to approximately match that of the high-density integrated circuit package. The downwardly opening coolant chamber is sealingly enclosed by a rigid thermally conductive membrane wall which is of special configuration so as to be in thermally conductive contiguous engagement with each of the plural dice of the high-density integrated circuit packages mounted therebelow in the base means regardless of dimensional irregularities resulting from manufacturing tolerances and the like.

A plurality of thermally conductive spheroids, or balls, are contained in and substantially fill the coolant chamber of the heat exchanger housing. The spheroids, which are preferably made of metal, are biased into bearing engagement with each other and with the thermally conductive rigid membrane wall by means of a resilient elastomeric pressure pad which is compressively interposed between the top wall, or roof, of the heat exchanger housing and the upper layer of the spheroids. Since there is a multiplicity of the spheroids, physical contact of the spheroids with the rigid membrane wall will be made at multiple points over virtually the entire inwardly facing surface of the membrane wall.

As is well known, the thermal conductivity of metal is far superior to that of liquids. Therefore, the heat conducted through the thermally conductive membrane wall is readily conducted to the metal spheroids at each point where the spheroids are in engagement with the membrane wall, and the heat is similarly transferred, or conducted, to each spheroid of the multiple spheroids contained in the coolant chamber in that each spheroid is in bearing engagement with the several spheroids adjacent thereto. This, in effect, results in a substantial increase in the heat exchange surface area which transfers heat by radiation, convection, and conduction to the coolant that is passed through the coolant chamber of the heat exchanger. The magnitude of the increase in the heat exchanger surface area will be appreciated upon consideration of the structure disclosed in my hereinbefore referenced prior art patent. In the first disclosed embodiment of that patent, the total heat exchange surface area is that of the inwardly facing surface of the pliant diaphragm less the points of engagement with the elastomeric biasing elements. In the second embodiment, the total heat exchange surface area was enhanced a bit by the biasing pistons. In the apparatus of the present invention, the total heat exchange surface area is the sum of the inner surface of the membrane wall (less the area of the contact points of the spheroids) plus the surface area of each of the spheroids (less the points where the spheroids touch each other and touch the elastomeric pressure pad and the sidewalls of the heat exchanger housing).

Other advantages of employing the plurality of metallic spheroids in the coolant chamber of the heat exchanger are that they present a tortuous flow path to prevent channelization, and the like, of the coolant which flows therethrough between the inlet and outlet ports thereof.

The above described apparatus may be employed in a chilled coolant circulation system wherein the chilled coolant (water) is recirculatingly passed through the coolant chamber of the apparatus. Such systems are well known in the art and in common use. However, as hereinbefore mentioned, it is preferred that the apparatus of the present invention be used in conjunction with a refrigeration system. When employed in such a combination, the heat exchanger of the apparatus is connected into the refrigeration system so that it becomes the evaporator component of the system. Thus, when the high pressure refrigerant, in the liquid state, enters into the heat exchanger, the pressure is lowered and the liquid will vaporize. As is known, when a liquid refrigerant vaporizes, it absorbs considerable amounts of heat. And this, is the most efficient way of carrying away the heat generated by operation of the high-density integrated circuit package.

Accordingly, it is an object of the present invention to provide a new and improved apparatus for cooling high-density integrated circuit packages.

Another object of the present invention is to provide a new and improved apparatus for cooling high-density integrated circuit packages which is of minimum complexity, cost and size.

Another object of the present invention is to provide a new and improved apparatus for cooling high-density integrated circuit packages and having improved heat transfer efficiency.

Another object of the present invention is to provide a new and improved apparatus for cooling high-density integrated circuit packages which includes an especially configured heat exchanger which sealingly encloses a high-density integrated circuit package within a base means and carries heat away from the package by means of a coolant which is passed through the heat exchanger.

Another object of the present invention is to provide an apparatus of the above described character wherein the heat exchanger includes a housing having a downwardly opening coolant chamber which is sealingly closed by a rigid thermally conductive membrane wall which is in thermally conductive contact with the circulating coolant and is especially configured to be in thermally conductive contact with the individual dice of the integrated circuit package regardless of dimensional differences.

Another object of the present invention is to provide an apparatus of the above described character wherein a plurality of metallic spheroids are contained within the coolant chamber of the heat exchanger and are biased into bearing engagement with each other and the membrane wall as a result of a resilient elastomeric pressure pad which is also contained in the coolant chamber so that the heat conducted away from the integrated circuit package by the membrane wall will be conductively absorbed by the spheroids to increase the effective heat exchange surface area which is in contact with the coolant for improved heat transfer purposes.

Still another object of the present invention is to provide an apparatus of the above described character wherein the multiple spheroids in the coolant chamber of the heat exchanger are arranged to present a tortuous coolant flow path through the coolant chamber.

Yet another object of the present invention is to provide an apparatus of the above described type wherein the apparatus is employed in combination with a refrigeration system by connecting the apparatus so that it is the evaporation component of the system.

The foregoing and other objects of the present invention, as well as the invention itself, may be more fully understood from the following description when read in conjunction with the accompanying drawings.

BRIEF DESCRIPTION OF THE DRAWINGS

FIG. 4 is a fragmentary sectional view taken along the line 4—4 of FIG. 1.

FIG. 5 is a fragmentary sectional view similar to FIG. 4 and showing a second embodiment of the apparatus of the present invention.

FIG. 6 is a fragmentary sectional view taken along the line 6—6 of FIG. 5.

FIG. 7 is a perspective view of one of the components of the second embodiment of the apparatus of the present invention.

DESCRIPTION OF THE PREFERRED EMBODIMENTS

Figure 1:
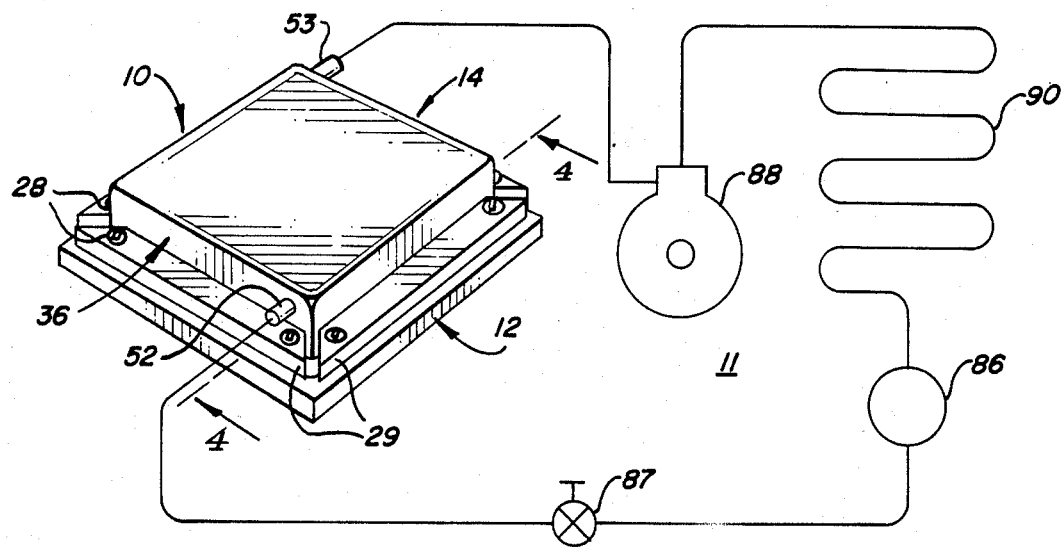
FIG. 1 is a perspective view of the apparatus for cooling high-density integrated circuit packages of the present invention, with the apparatus being shown in combination with a refrigeration system.

Referring more particularly to the drawings, wherein the apparatus for cooling high-density integrated circuit packages is identified in its entirety by the reference numeral 10. As will hereinafter be described in detail, the apparatus 10 is preferably used in conjunction with a refrigeration system 11, and includes two basic elements, namely a base means 12 and a heat exchanger 14, which sealingly enclose a high-density integrated circuit package 16 (FIG. 4) and carry away the heat generated by operation of the circuit package.

The base means 12 is best seen in FIG. 4 to be a substantially planar housing 18 having a floor 19 with an endless upstanding sidewall 20 which defines an upwardly opening chamber 22 for nestingly receiving the circuit package 16. The floor 19 is provided with a plurality of apertures 23 which are arranged in a geometric array which matches the array of conductive pins 24 which depend from the circuit package 16, so that each of the pins 24 passes through a different one of the apertures 23 so as to extend beyond the floor 19 of the base means. A suitable seal 25 such as of glass, is provided in the aperatures so that the base means will be a hermetically sealed structure for reasons which will become apparent as this description progresses.

The base means 12 is also provided with internally threaded bores 26 at its corners for containing fastener means 28 by which the heat exchanger 14 is demountably mounted on the base means 12. As seen best in FIGS. 2 and 4, the fastener means 28 pass through suitable bores formed through clamping bars 29 which are suitably configured to clampingly and demountably attach the heat exchanger 14 on the base means 12.

The high-density integrated circuit package 16 forms no part of the apparatus of the present invention, but is shown and will now be briefly described for completeness of this disclosure. The package 16 includes a multi-layer substrate 30, usually of ceramic, and the hereinbefore mentioned multiplicity of pins 24 extend from one planar surface of the substrate. The pins 24 provide means for making the necessary electrical interconnections between the integrated circuit package 16 and the other components of the system (not shown) in which the package is to be used. Further, in accordance with customary practices, the pins 24 are also used to mount the package on a circuit board (not shown) by soldering the pins in holes provided on the circuit board. The opposite planar surface 31 of the multi-layer substrate 30 has a plurality of discrete integrated circuits 32, or dice, mounted thereon in a predetermined geometric array which usually consists of a plurality of equally spaced rows and columns.

As seen in FIG. 4, the upwardly opening chamber 22 of the base means 12 is deeper than the thickness dimension of the substrate 30 and an elastomeric seal 34, preferably of square sided ring-like shape, is contained in an endless groove formed in the upwardly facing surface of the sidewall 20. The seal 34 extends above the upwardly facing surface of the endless sidewall 20 of the base means 12, and is used to sealingly encase the integrated circuit package 16 in the apparatus 10 as will hereinafter be described in detail.

The heat exchanger 14 includes a housing 36 of relatively thick wall material, preferably metal, which is configured to define a downwardly opening chamber 38 which will hereinafter be referred to as the coolant chamber for reasons which will soon become apparent. The housing 36 includes a roof wall 39 with an integrally depending endless sidewall formed of sidewall segments 40a, 40b, 40c and 40d, which cooperatively define the coolant chamber 38. An endless flange 42 extends normally from the sidewall of the housing.

The coolant chamber 38 of the heat exchanger 14 is sealingly closed by a rigid membrane means 46. The membrane means 46 includes a rigid wall 47, preferably formed of a metal having good heat transfer properties, such as copper, with the peripheral edges of the rigid wall being wrapped around the endless flange 42 of the housing 36 for fixed sealed attachment thereto such as by soldering, welding, or the like, as at 48. The membrane means 46 preferably further includes a deformable contact member 49 which is fixedly attached to the heat input surface of the rigid wall 47. The contact member 49 includes a resiliently compressible means in the preferred form of a woven wire mesh screen 50 which is in coextensive contiguous engagement with the heat input surface of the rigid wall 47 and a pliable thin-wall diaphragm 51 which is in juxtaposed contiguous relationship with the wire mesh screen 50. The peripheral edges of the diaphragm are fixedly attached to the wall 47, such as by soldering or welding, so as to hold and enclose the mesh screen 50. The enclosed screen is impregnated with a high heat transfer material, such as silicone grease, so as to fill the cavity between the diaphragm 51 and the rigid wall 47.

As is well known, in a production environment, it is virtually impossible to manufacture anything to an exact dimension or dimensions. This also applies to the discrete dice 32, the multi-layer substrate 30, and the spacing between the dice and the substrate occupied by the soldered attachment of the dice on the substrate. Therefore, there will be different height dimensions between the upper surface of the substrate and the upper surfaces of the discrete dice. The deformable contact member 49 of the membrane means 46 is intended to compensate for such dimension irregularities. The wire screen 50 will yieldably bias the pliant diaphragm 51 in the extended position and, will conform to the height differences of the plurality of discrete dice 32. And, this will insure that a good contiguous contact is made between the dice and the membrane means 46 which is necessary for proper heat transfer characteristics.

The coolant chamber 38 of the heat exchanger 14 is provided with a coolant inlet fitting 52 in the sidewall segment 40c of the housing 36, and a coolant outlet fitting 53 is mounted in the opposite sidewall segment 40a. As hereinbefore mentioned, it is preferred that the apparatus 10 be used in combination with the refrigeration system 11, and for this reason, the coolant inlet fitting 52 is shown as being provided with a relatively small inlet passage 54 for admitting the liquid refrigerant to the coolant chamber 38, and the outlet fitting 53 is considerably larger for proper egress of the gaseous refrigerant.

It is to be understood, however, that the apparatus 10 may be used with a suitable liquid coolant system (not shown), such as a chilled water system, wherein the chilled liquid coolant is passed through the coolant chamber 38 under pressure. When the apparatus 10 is used with a suitable liquid coolant system, the inlet and outlet fittings 52 and 53, respectively, can be of the same size. It will be noticed in FIG. 4, however, that the fittings are of special configuration, and this will be the case regardless of the usage of the apparatus 10 as will hereinafter be described in detail.

A plurality of spheroids 56 and a resilient elastomeric pressure pad 57 are both contained within the coolant chamber 38 of the heat exchanger. The spheroids are formed of a material having good thermal conduction properties, such as metal, for reasons which will hereinafter be described, and are seen to substantially fill the coolant chamber. The pressure pad 57 is compressingly interposed between the inwardly facing surface of the roof wall 39 and the upper layer of the spheroids 56. In this manner, the pressure pad 57 will biasingly urge the spheroids 56 toward the membrane means 46. The biasing force applied to the spheroids 56 by the pressure pad 57 will positively hold the spheroids in thermally conductive contact with the inner surface of the membrane means and in contact with each other. In this manner, the heat conducted away from the high density integrated circuit package 16 by the rigid membrane means 46 will be transferred by conduction to each of the spheroids 56, and this significantly improves the heat exchange capabilities of the apparatus 10 by providing a maximum heat exchange surface area into which the coolant comes in contact.

Figure 2:
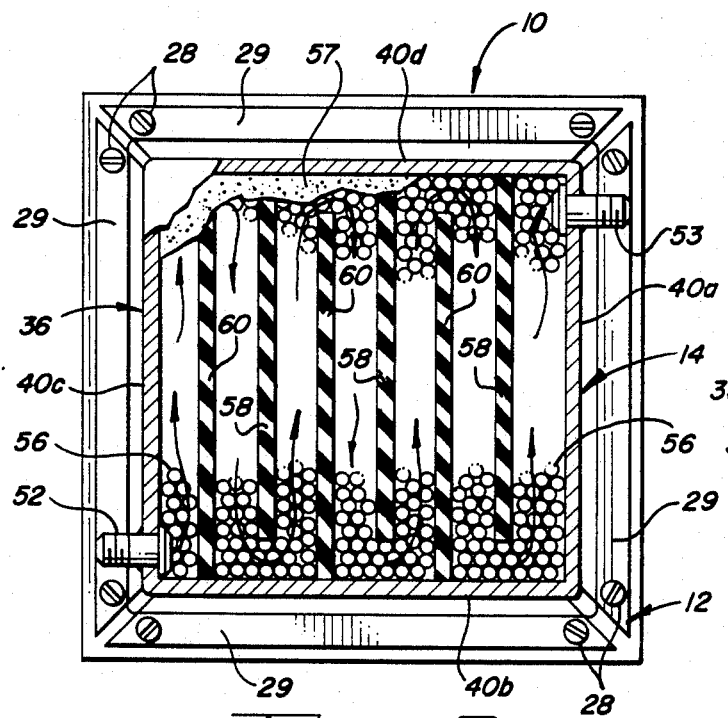
FIG. 2 is a plan view of the apparatus of the present invention with portions thereof being broken away to show the various features thereof.

In addition to providing maximum heat exchange surface area, the spheroids provide another advantage. The additional advantage provided by the multiplicity of spheroids 56 is that they provide a tortuous flow path for the coolant which passes through the heat exchanger 14 to prevent localized hotspots which could otherwise occur as a result of channelization, and the like. To insure that channelization, and the like, does not occur, the resilient elastomeric pressure pad 57 may be provided with plural depending partitions 58 and 60, which integrally depend from the pad and have their depending edges proximate but spaced upwardly from the membrane means 46 as seen best in FIG. 4. FIG. 2 shows each of the partitions 60 as having one of their ends in abutting engagement with the sidewall segment 40d of the heat exchanger housing 36 and having their opposite ends spaced from the sidewall segment 40b to provide a flow directing path, or channel around the partition 60. Each of the other partitions 58 are seen to have one of their ends in abutting engagement with the sidewall segment 40b and having their other ends spaced from the sidewall segment 40d to provide an opposite flow path or channel around that partition. Thus, the total effect of this lateral staggering of the depending partitions 58 and 60 will be seen to direct or guide the coolant flow in a sinusoidal path through the coolant chamber.

The resilient elastomeric pressure pad 57 is preferably made of a high-temperature resilient elastomeric material, such as silicone, and may be impregnated during fabrication with a metallic particle filler so that heat may be transferred therethrough to the heat exchanger housing 36 thus allowing it to act as a heat sink.

The hereinbefore mentioned special configuration of the coolant inlet and outlet fittings 52 and 53 is seen best in FIG. 4 wherein the fitting 52 is shown in partial section. As seen, the fitting 52, and thus the fitting 53 which is identical thereto except in size, have tubular bodies or shanks with external threads being provided on the outwardly extending ends. The inner end of each of the fittings is provided with an enlarged head having radial slots. This special head configuration is advantageous so that the flow of coolant cannot be restricted, or completely blocked, by one of the spheroids 56 moving into or being in a position wherein it would block the axial mouth of the bore of the fitting shank.

When the heat exchanger 14 is mounted on the base means 12, the integrated circuit package 16 is sealingly enclosed in the chamber 22 of the base means 12, as hereinbefore mentioned. To improve the overall heat transfer capabilities of the apparatus 10, the chamber 22 may have the air in the sealed chamber 22 extracted therefrom and replaced with a high thermally conductive gas, such as helium. This may be accomplished, for example, by, as shown in FIG. 4, providing a suitable port 59 in the floor 19 of the base means 12 and inserting a plug 61 therein after the chamber 22 has been filled with the thermally conductive gas.

Reference is now made to FIGS. 5, 6 and 7, wherein a second embodiment of the apparatus of the present invention is shown, with this second embodiment being indicated in its entirety by the reference numeral 10a.

The base means 12 is identical to that hereinbefore described and thus that description will not be repeated. The integrated circuit package 16a is essentially the same but shows the discrete dice as being of two different sizes, e.g. the dice 32 are the same as those shown in FIG. 4 and hereinbefore described. However, the dice 32a are smaller. It will be understood that discrete dice are commonly manufactured in different sizes, and the reason for showing the two different sizes in FIG. 5 will hereinafter be described.

The heat exchanger 14 includes the above described housing 36 which defines the downwardly opening coolant chamber 38 and from which the endless flange 42 extends laterally. A modified form of rigid membrane means 62 is employed in this second embodiment of the present invention. The membrane means 62 includes a rigid wall 64 which is fixedly attached to the flange 42 of the housing 36 in the manner hereinbefore described and has substantially V-shaped in cross section grooves 66 and 68 cast, stamped, or otherwise formed therein so that the grooves open onto the heat input face of the rigid wall 64. As shown, the grooves 66 and 68 protrude upwardly into the coolant chamber 38 and are laterally staggered with respect to each other, as indicated in FIG. 6, and this lateral staggering will guide the flow of coolant through the coolant chamber 38 much in the same manner as did the hereinbefore described partitions 58 and 60 of the first embodiment. In that the V-shaped grooves 66 and 68 perform the coolant flow guiding function, the resilient pressure pad 70 of this second embodiment is of simple planar configuration, but it still accomplishes the objective of biasing the metallic spheroids 56 into thermally conductive contact with each other and with the inner surface of the membrane means 62.

The membrane means 62 further includes contact members in the preferred form of a pair of thermal blocks 74 and 76 separated by a resilient spacer 78. The thermal blocks 74 and 76 are each of triangular configuration having a base surface 79, vertical surface 80 and an inclined surface 81. The thermal blocks are disposed in the V-shaped grooves 66 and 68 in a back-to-back arrangement, that is, their respective vertical surfaces 80 are in bearing engagement with opposite surfaces of the resilient spacer 78. The base surface 79 of the thermal blocks are in bearing engagement with the upper surface of the discrete dice 32 and 32a and their inclined surfaces 81 are in bearing engagement with the angularly inclined surfaces of the rigid metal wall 64 which defines the V-shaped grooves.

Each back-to-back pair of the thermal blocks 74 and 76 are biasingly urged away from each other by the resilient spacer 78, but, due to the inclined surfaces of the V-shaped grooves and the blocks, the resultant forces will not only tend to separate the blocks, but will also tend to move them downwardly into contiguous bearing engagement with the upper surface of the dice 32 and 32a. There will, therefore, be a good thermally conductive contact between the dice 32 and 32a and the base surfaces of the thermal blocks, and between the angularly inclined surfaces of the thermal blocks and the rigid metallic wall 64 of the membrane means 62. Thus, operational heat of the dice will be carried away via the thermal blocks through the rigid wall 64 into the coolant chamber 38, and the blocks will automatically position themselves to compensate for dimensional differences in the heights of the various discrete dice.

As shown in FIG. 5, the two thermal blocks 74 and 76 can be arranged atop the relatively large dice 32, or they can be arranged atop different dice as is shown with regard to the relatively smaller dice 32a.

The thermal blocks 74 and 76 are formed of a good thermally conductive material such as copper, aluminum, or the like. Also, the blocks can be of solid configuration as shown in FIG. 5, or they can be of hollow core configuration as shown in the thermal block 84 in FIG. 7.

As hereinbefore mentioned, the apparatus 10 and 10a are preferably used in combination with the refrigeration system 11 which is shown in FIG. 1. Since refrigeration systems are well known in the art, the system 11 is illustrated here in a very basic diagrammatic form and the following brief description is provided for completeness of this disclosure.

A refrigerant, such as freon, is in a tank 86, or liquid receiver, under high pressure and is in a liquid state. As the refrigerant enters the expansion valve 87, the pressure is lowered and the liquid begins to vaporize. Complete evaporation takes place when the refrigerant moves into the evaporator which, in accordance with this invention, is the heat exchanger 14 of the apparatus 10. As is well known with evaporation, heat must be added and this is supplied by the operation of the high density integrated circuit package 16 (FIG. 4). The vaporized refrigerant is now under low pressure and the compressor 88 operates to build up the pressure sufficiently to condense the refrigerant. In order for the refrigerant to return to a liquid state, the heat picked up in the heat exchanger 14 and in the compressor 88 must be removed and that is accomplished by means of a condenser coil 90. As the refrigerant cools, it condenses into the liquid state and moves into the liquid receiver 86.

Figure 3:
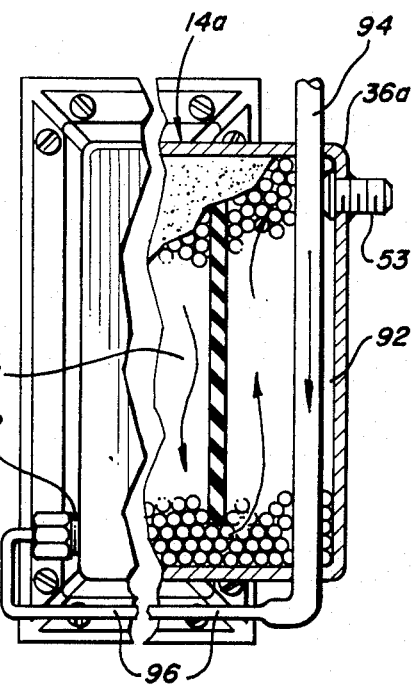
FIG. 3 is a fragmentary view similar to FIG. 2 and showing a modification thereof.

Reference is now made to FIG. 3 wherein a modified form of heat exchanger 14a is shown. This modified heat exchanger 14a is especially fabricated for use in combination with the above described refrigeration system 11. The heat exchanger 14a is essentially the same as the hereinbefore fully described heat exchanger 14 with the exception of being provided with a refrigerant pre-cooler section 92 within the coolant chamber 38a. In this embodiment, the housing 36a is enlarged proximate the refrigerant outlet side thereof, and a liquid refrigerant input line 94 connected between the expansion valve 87 and the inlet fitting 52 passes through the pre-cooler section 92. This input line 94, which is preferably an integral part of the heat exchanger 14a, exits from the pre-cooler section 92 and is coupled by means of a capillary tube 96 to the inlet fitting 52 of the heat exchanger. As indicated by the flow directions of the arrows in FIG. 3, the liquid freon passing through the input line 94 moves countercurrent to the flow of gaseous refrigerant in the coolant chamber 38a. The liquid refrigerant is relatively hot even after its passage through the condenser coil 90, and the vaporized refrigerant is relatively cool even after its passage through the greater part of the coolant chamber 38a. Therefore, the pre-cooler section 92 operates to extract heat from the liquid refrigerant before it enters the heat exchanger 14a and this results in higher efficiency cooling of the integrated circuit package 16. The capillary tube 96 is a commonly used element in refrigeration systems for controlling the flow of refrigerant.

While the principles of the invention have now been made clear in the illustrated embodiments, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits and scope of the invention.

What I claim is:

1. An apparatus for cooling a high-density integrated circuit package of the type having a substrate with a plurality of discrete integrated circuits arranged thereon in a predetermined array, said apparatus comprising:
   (a) a housing defining an open coolant chamber which is sized so that its opening substantially matches the surface area of the substrate of the integrated circuit package, said housing for positioning in overlaying relationship with respect to the integrated circuit package;
   (b) a rigid wall means of thermally conductive material fixedly attached to said housing for sealingly enclosing the coolant chamber thereof and having a heat input surface;
   (c) a thermally conductive contact means interposed between the heat input surface of said rigid wall means and the integrated circuit package when said housing is in overlaying relationship therewith, said contact means being conformable to compensate for dimensional variations to provide positive thermal contact with the heat input surface of said rigid wall and with each of the discrete integrated circuits;

(d) said housing having an inlet port and an outlet port by which coolant is passable through the coolant chamber of said housing; and (e) a plurality of spheroids in the coolant chamber of said housing and substantially filling the coolant chamber, each of said spheroids being of metal for conducting heat away from said rigid wall for maximizing the heat exchange surface area into which the coolant comes in contact when passed through the coolant chamber of said housing.

2. An apparatus as claimed in claim 1 and further comprising:

(a) said rigid wall means being of substantially planar configuration; and (b) said thermally conductive contact means including, I. a resiliently compressible means in coextensive contiguous engagement with the heat input surface of said rigid wall, II. a thin-wall pliable diaphragm in contiguous engagement with said resiliently compressible means and having its peripheral edges affixed to said rigid wall for sealingly enclosing said resiliently compressible means, III. thermal grease in the area between said rigid wall and said diaphragm.

3. An apparatus as claimed in claim 2 wherein said resiliently compressible means is a woven wire mesh screen.

4. An apparatus as claimed in Claim 1 and further comprising:

(a) said rigid wall being provided at least one substantially V-shaped groove formed therein, said V-shaped groove defining a pair of angular walls and being arranged so as to open away from the coolant chamber of said housing; and (b) said thermally conductive contact means including, I. a pair of thermal blocks arranged in a back-toback position within said V-shaped groove of said rigid wall and in slidable bearing engagement with said pair of angular walls defined by said Vshaped groove, II. biasing means between said pair of thermal blocks for yieldably biasing said pair of thermal blocks into thermally conductive contact with the angular walls of said V-shaped groove of said rigid wall and into thermally conductive contact with at least one of the discrete integrated circuits when said housing is in overlaying relationship with said integrated circuit package.

5. An apparatus as claimed in claim 4 wherein each of said thermal blocks has a vertical wall for engagement with said biasing means, an inclined wall for engagement with one of the angular walls of said V-shaped groove and a base wall for engaging at least one of the discrete integrated circuits.

6. An apparatus as claimed in claim 5 wherein said biasing means between said pair of thermal blocks is an elastomeric pad.

7. An apparatus as claimed in claim 1 and further comprising biasing means in the coolant chamber of said housing and disposed between said housing and said plurality of spheroids for biasing said spheroids into thermally conductive contact with each other and with said rigid wall.

8. An apparatus as claimed in claim 7 wherein said biasing means is a resilient elastomeric pressure pad which is compressingly interposed between said housing and said plurality of spheroids.

9. An apparatus as claimed in claim 8 wherein said resilient elastomeric pressure pad is provided with at least a spaced pair of partitions which depend therefrom into spaced proximity with said diaphragm.

10. An apparatus as claimed in claim 1 wherein said housing comprises:

(a) a roof wall of substantially planar configuration; and (b) an endless sidewall extending normally from the periphery of said roof wall.

11. An apparatus as claimed in claim 1 and further comprising:

(a) base means defining an open chamber for nestingly receiving the integrated circuit package; and (b) cooperative elements of a demountable connection on said base means and on said housing for attaching said housing to said base means in overlaying relationship with the integrated circuit package when it is nestingly received in said base means.

12. An apparatus as claimed in claim 11 and further comprising:

(a) said open chamber of said base means being deeper than the thickness dimension of the substrate of the integrated circuit package; and (b) an endless ring-shaped elastomeric seal mounted on said base means so as to surround the open chamber thereof and configured to extend upwardly from said base means for sealingly engaging said housing.

13. An apparatus as claimed in claim 1 and further comprising a refrigeration system for supplying high pressure liquid refrigerant to said inlet port for evaporation within the coolant chamber of said housing and for receiving the vaporized gaseous refrigerant from said outlet port, compressing and cooling the refrigerant to its liquid state for resupplying thereof to said inlet port.

14. The combination of an apparatus and refrigeration system for cooling a high-density integrated circuit package of the type having a substrate with a plurality of discrete integrated circuits arranged thereon in a predetermined array, said combination comprising:

(a) a housing defining an open coolant chamber which is sized to substantially match the surface area of the substrate of the integrated circuit package, said housing being positionable in overlying relationship with said integrated circuit package and having an inlet port and an outlet port;

(b) a rigid wall means of thermally conductive material affixed to said housing for sealingly enclosing the coolant chamber thereof and having a heat input surface;

(c) a thermally conductive contact means between the heat input surface of said rigid wall means and the integrated circuit package when said housing is in overlying relationship therewith, said contact means being conformable to compensate for dimensional variations to provide positive thermal contact with the heat input surface of said rigid wall and with each of the discrete integrated circuits;

(d) a plurality of spheroids in the coolant chamber of said housing and substantially filling the coolant chamber, said spheroids being formed of metal for conducting heat away from said rigid wall for maximizing the heat exchange surface area within the coolant chamber of said housing; and (e) a refrigeration system having a refrigerant input line coupled to the inlet port of said housing for supplying high pressure liquid refrigerant to the coolant chamber thereof so that the liquid refrigerant will vaporize therein to absorb operational heat of the integrated circuit package when said housing in in overlaying relationship therewith and the integrated circuit package is operating, said refrigeration system having a refrigerant outlet line coupled to the outlet port of said housing for receiving the vaporized refrigerant therefrom so that said refrigeration system can compress and cool the refrigerant back to a liquid state for resupplying thereof to the inlet port of said housing.

15. The combination of claim 14 and further comprising:

(a) said rigid wall means being of substantially planar configuration; and (b) said thermally conductive contact means including, I. a resiliently compressible means in coextensive contiguous engagement with the heat input surface of said inlet, II. a thin-wall pliable diaphragm in contiguous engagement with said resiliently compressible means and having its peripheral edges affixed to said rigid wall for sealingly enclosing said resiliently compressible means, III. thermal grease in the area between said rigid wall and said diaphragm.

16. The combination of claim 15 wherein said resiliently compressible means is a woven wire mesh screen.

17. The combination of Claim 14 and further comprising:

(a) said rigid wall being provided with at least one substantially V-shaped groove formed therein, said V-shaped groove defining a pair of angular walls and being arranged so as to open away from the coolant chamber of said housing; and (b) said thermally conductive contact means including, I. a pair of thermal blocks arranged in a back-to-back position within said V-shaped groove of said rigid wall and in slidable bearing engagement with said pair of angular walls defined by said V-shaped groove, II. biasing means between said pair of thermal blocks for yieldably biasing said pair of thermal blocks into thermally conductive contact with the angular walls of said V-shaped groove of said rigid wall and into thermally conductive contact with at least one of the discrete integrated circuits when said housing is in overlying relationship with said integrated circuit package.

18. The combination of claim 17 wherein each of said thermal blocks has a vertical wall for engagement with said biasing means, an inclined wall for engagement with one of the angular walls of said V-shaped groove and a base wall for engaging at least one of the discrete integrated circuits.

19. The combination of claim 18 wherein said biasing means between said pair of thermal blocks is an elastomeric pad.

20. The combination of claim 14 and further comprising biasing means in the coolant chamber of said housing and disposed between said housing and said plurality of spheroids for biasing said spheroids into thermally conductive contact with each other and with said rigid wall.

21. The combination of claim 20 wherein said biasing means is a resilient elastomeric pressure pad which is compressingly interposed between said housing and said plurality of spheroids.

22. The combination of claim 21 wherein said resilient elastomeric pressure pad is provided with at least a spaced pair of partitions which depend therefrom into spaced proximity with said rigid wall.

23. The combination of claim 14 wherein said housing comprises:

(a) a roof wall of substantially planar configuration; and (b) an endless sidewall extending normally from the periphery of said roof wall.

24. The combination of claim 14 and further comprising:

(a) base means defining an open chamber for nestingly receiving the integrated circuit package; and (b) cooperative elements of a demountable connection on said base means and on said housing for attaching said housing to said base means in overlaying relationship with the integrated circuit package when it is nestingly received in said base means.

25. The combination of claim 24 and further comprising:

(a) said open chamber of said base means being deeper than the thickness dimension of the substrate of the integrated circuit package; and (b) an endless ring-shaped elastomeric seal mounted on said base means so as to surround the open chamber thereof and configured to extend upwardly from said base means for sealingly engaging said housing.

26. The combination of claim 14 and further comprising:

(a) said housing being configured to provide a pre-cooling portion within the coolant chamber defined thereby, said pre-cooling portion being disposed proximate the outlet port of said housing; and (b) said refrigerant input line of said refrigeration system having a terminal portion thereof passing through the pre-cooling portion of said coolant chamber and extending therefrom to the inlet port of said housing for cooling of the liquid refrigerant on its way into the coolant chamber of said housing.

27. The combination of claim 26 wherein the flow of liquid coolant through said refrigerant input line is countercurrent to the flow of vaporized refrigerant through said pre-cooling portion of said coolant chamber for maximizing the heat exchange therebetween.

28. The combination of claim 26 wherein that portion of the refrigerant input line which extends between said coolant chamber and said inlet port of said housing is in the form of a capillary tube.

* * * * *